United States Patent
Jang et al.

(10) Patent No.: US 10,727,366 B2
(45) Date of Patent: Jul. 28, 2020

(54) SOLAR CELL COMPRISING CIGS LIGHT ABSORBING LAYER AND METHOD FOR MANUFACTURING SAME

(71) Applicant: MECAROENERGY CO., LTD., Chungcheongbuk-do (KR)

(72) Inventors: Hyuk Kyoo Jang, Chungcheongbuk-do (KR); Dong Soo Seok, Chungcheongbuk-do (KR); Gyu Hyun Lee, Chungcheongbuk-do (KR); Ho Gun Lee, Chungcheongbuk-do (KR)

(73) Assignee: MECAROENERGY CO., LTD., Eumseong-Gun, Chungcheongbuk-Do (KR)

( * ) Notice: Subject to any disclaimer, the term of this patent is extended or adjusted under 35 U.S.C. 154(b) by 38 days.

(21) Appl. No.: 16/066,631

(22) PCT Filed: Jan. 13, 2016

(86) PCT No.: PCT/KR2016/000371
§ 371 (c)(1),
(2) Date: Jun. 27, 2018

(87) PCT Pub. No.: WO2017/122842
PCT Pub. Date: Jul. 20, 2017

(65) Prior Publication Data
US 2019/0157487 A1     May 23, 2019

(51) Int. Cl.
*H01L 31/072*     (2012.01)
*H01L 31/18*     (2006.01)
(Continued)

(52) U.S. Cl.
CPC .......... *H01L 31/072* (2013.01); *C23C 16/305* (2013.01); *C23C 16/56* (2013.01);
(Continued)

(58) Field of Classification Search
CPC ..................................................... H01L 31/072
See application file for complete search history.

(56) References Cited

U.S. PATENT DOCUMENTS

| | | | | |
|---|---|---|---|---|
| 2005/0028861 A1* | 2/2005 | Aoki | .................. | H01L 31/0322 136/256 |
| 2005/0236032 A1* | 10/2005 | Aoki | .................. | H01L 31/0749 136/252 |
| 2011/0117692 A1* | 5/2011 | Chuang | ............... | H01L 31/0322 438/95 |

FOREIGN PATENT DOCUMENTS

| | | | |
|---|---|---|---|
| KR | 10-2010-0035780 A | | 4/2010 |
| KR | 20100035780 A | * | 4/2010 |

(Continued)

OTHER PUBLICATIONS

Lee et al., KR-20100035780-A, English Machine Translation. (Year: 2010).*
Jang et al., KR-101472409-B1, English Machine Translation. (Year: 2014).*
Jang et al., Wo-2011111889-A1 , English Machine Translation (Year: 2011).*

(Continued)

*Primary Examiner* — Tae-Sik Kang
(74) *Attorney, Agent, or Firm* — Masuvalley & Partners

(57) ABSTRACT

The resent invention relates to a method for manufacturing a solar cell, the method comprising the steps of: (a) forming a lower electrode layer on a substrate; (b) forming a CIGS light absorbing layer on the lower electrode layer by supplying a copper precursor to deposit a copper thin film using chemical vapor deposition and then supplying a gallium precursor, an indium precursor, and a first selenium precursor to deposit a gallium thin film and an indium-selenium thin film using chemical vapor deposition; and (c) sequentially forming a buffer layer and a front electrode layer on the CIGS light absorbing layer.

5 Claims, 3 Drawing Sheets

(51) Int. Cl.
  *H01L 31/0749* (2012.01)
  *H01L 21/02* (2006.01)
  *C23C 16/56* (2006.01)
  *C23C 16/30* (2006.01)
  *H01L 31/0224* (2006.01)
  *H01L 31/032* (2006.01)

(52) U.S. Cl.
  CPC .... *H01L 21/0262* (2013.01); *H01L 21/02491* (2013.01); *H01L 21/02568* (2013.01); *H01L 31/022425* (2013.01); *H01L 31/0322* (2013.01); *H01L 31/0749* (2013.01); *H01L 31/18* (2013.01); *Y02E 10/50* (2013.01); *Y02P 70/521* (2015.11)

(56) References Cited

FOREIGN PATENT DOCUMENTS

| | | | |
|---|---|---|---|
| KR | 10-2012-0051206 A | 5/2012 | |
| KR | 10-2013-0059177 A | 6/2013 | |
| KR | 10-1472409 B1 | 12/2014 | |
| KR | 101472409 B1 * | 12/2014 | |
| KR | 10-1482786 B1 | 1/2015 | |
| WO | WO-2011111889 A1 * | 9/2011 | ............ C23C 16/18 |

OTHER PUBLICATIONS

ISA/KR, International Search Report dated Sep. 30, 2016 in International Application No. PCT/KR2016/000371, total 4 pages with English translation.

* cited by examiner

SOLAR CELL COMPRISING CIGS LIGHT ABSORBING LAYER AND METHOD FOR MANUFACTURING SAME

RELATED APPLICATIONS

This application is the U.S. National Phase of and claims priority to International Patent Application no. PCT/KR2016/000371, International Filing Date Jan. 13, 2016, which is hereby incorporated by reference in its entirety for all purposes.

TECHNICAL FIELD

The present invention relates to a solar cell including a CIGS light absorbing layer and a method of manufacturing the same.

BACKGROUND OF THE DISCLOSURE

In recent years, as a part of the development of new and renewable energy to reduce carbon emissions according to environmental regulations, solar cells, which are capable of converting solar energy into electrical energy so that there are few restrictions on the installation site and electric power can be easily generated, have been attracting attention.

Such a solar cell is manufactured using a monocrystalline or polycrystalline silicon wafer, but monocrystalline silicon is generally used most widely in the field of large-scale power generation systems due to having higher photoelectric conversion efficiency. However, such monocrystalline silicon is uneconomical because of its complicated manufacturing process and high price.

Accordingly, despite relatively low efficiency, a method of manufacturing a solar cell using polycrystalline silicon using a low-grade silicon wafer has been developed and is currently being used in power generation systems for residential use and the like. However, this process is also complicated, and there is a limit to lowering the manufacturing cost of the solar cell due to the increase in the price of raw materials attributable to the price of silicon.

Accordingly, as a thin film solar cell for overcoming this problem, a method of using amorphous silicon having a multi junction structure and a method of using a compound semiconductor such as a chalcogenide-based compound have been developed recently.

Among them, a solar cell manufactured using $Cu(In_{1-x}Ga_x)Se_2$ (hereinafter, referred to as CIGS) which is a chalcogenide-based compound as a CIGS light absorbing layer has been evaluated as a highly efficient and low cost candidate.

SUMMARY OF THE INVENTION

The present invention provides a method of manufacturing a solar cell, including the steps of: (a) forming a lower electrode layer on a substrate; (b) forming a CIGS light absorbing layer on the lower electrode layer by supplying a copper precursor to deposit a copper thin film using chemical vapor deposition and then supplying a gallium precursor, an indium precursor, and a first selenium precursor to deposit a gallium thin film and an indium-selenium thin film using chemical vapor deposition; and (c) sequentially forming a buffer layer and a front electrode layer on the CIGS light absorbing layer.

However, the scope of the present invention is not limited to the above-described object, and other unmentioned objects may be clearly understood by those skilled in the art from the following descriptions.

The present invention provides a method of manufacturing a solar cell, including the steps of: (a) forming a lower electrode layer on a substrate; (b) forming a CIGS light absorbing layer on the lower electrode layer by supplying a copper precursor to deposit a copper thin film using chemical vapor deposition and then supplying a gallium precursor, an indium precursor, and a first selenium precursor to deposit a gallium thin film and an indium-selenium thin film using chemical vapor deposition; and (c) sequentially forming a buffer layer and a front electrode layer on the CIGS light absorbing layer.

In step (b), the gallium precursor, the indium precursor and the first selenium precursor may be sequentially supplied so that the gallium thin film is deposited first, and then the indium-selenium thin film is deposited.

In step (b), a second selenium precursor may be simultaneously supplied with the gallium precursor to deposit a gallium-selenium thin film.

In step (b), the gallium precursor may include one or more selected from the group consisting of trimethyl gallium, triethyl gallium, triisopropyl gallium, tributyl gallium, tritertiarybutyl gallium, trimethoxy gallium, triethoxy gallium, triisopropoxy gallium, dimethylisopropoxy gallium, diethylisopropoxy gallium, dimethylethyl gallium, diethylmethyl gallium, dimethylisopropyl gallium, diethylisopropyl gallium and dimethyltertiarybutyl gallium.

In step (b), the gallium precursor may be supplied while a canister temperature is maintained at −40 to 100° C. and a feed line temperature is maintained at 25 to 200° C.

In step (b), the second selenium precursor may include one or more selected from the group consisting of dimethyl selenide, diethyl selenide, diisopropyl selenide, ditertiarybutyl selenide, dimethyl diselenide, diethyl diselenide, diisopropyl diselenide, ditertiarybutyl diselenide, tertiarybutylisopropyl selenide and tertiarybutylselenol.

Step (b) may further include a step of heat treatment.

The heat treatment may be performed at a temperature of 200 to 600° C. for 1 to 50 minutes.

According to an embodiment of the present invention, there is provided a solar cell, including a lower electrode layer, a CIGS light absorbing layer, a buffer layer and a front electrode layer, wherein a selenium deficit occurs in a lower surface region of the CIGS light absorbing layer in contact with the lower electrode layer.

The thickness of a $MoSe_x$ layer formed between the lower electrode layer and the CIGS light absorbing layer may be 10 nm or less.

A copper deficit may occur in an upper surface region of the CIGS light absorbing layer in contact with the buffer layer.

The band gap energy of the CIGS light absorbing layer may be in a range of 1.2 to 1.8 eV.

In the solar cell according to the present invention, a CIGS light absorbing layer having low porosity and a large average crystal grain size is formed on the lower electrode layer by supplying a copper precursor to deposit a copper thin film using chemical vapor deposition and then supplying a gallium precursor, an indium precursor, and a first selenium precursor to deposit a gallium thin film and an indium-selenium thin film using chemical vapor deposition, and thus not only can the formation of the $MoSe_x$ layer be minimized, but also the performance of the solar cell can be improved.

DETAILED DESCRIPTION OF THE INVENTION

Figure 1:
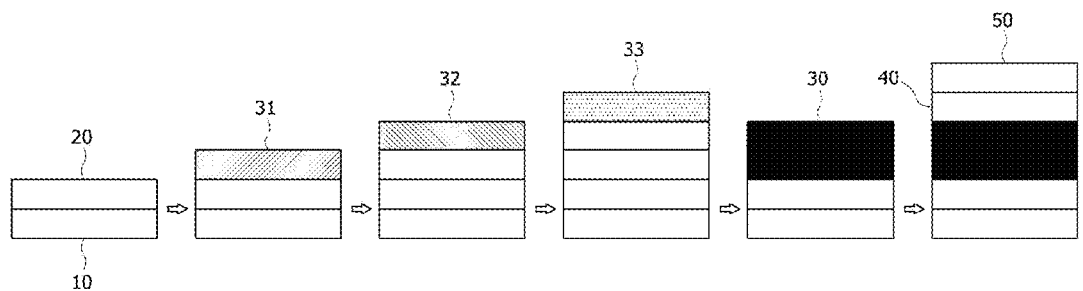
FIG. 1 shows a method of manufacturing a solar cell including a CIGS light absorbing layer according to an embodiment of the present invention.

Hereinafter, embodiments will be described in detail with reference to the accompanying drawings so that those skilled in the art can easily carry out the embodiments. However, the embodiments are not limited to those described below and may have various modifications.

In addition, those parts which are not related to the description are omitted from the accompanying drawings in order to more clearly describe the present invention, and the same reference numerals and signs are used throughout the specification in order to denote the same or similar components.

In the drawings, thicknesses are enlarged for clearer indication of various layers and regions. In addition, thicknesses of some layers and regions are exaggerated for convenience of explanation.

It will be understood that, when an element such as a layer, film, region or substrate is referred to as being placed "on (or under or below)" another element, it can be directly placed on (or under or below) the other element, or intervening layer(s) may also be present.

Hereinafter, the present invention will be described in detail.

The present invention provides a method of manufacturing a solar cell, including the steps of: (a) forming a lower electrode layer on a substrate; (b) forming a CIGS light absorbing layer on the lower electrode layer by supplying a copper precursor to deposit a copper thin film using chemical vapor deposition and then supplying a gallium precursor, an indium precursor, and a first selenium precursor to deposit a gallium thin film and an indium-selenium thin film using chemical vapor deposition; and (c) sequentially forming a buffer layer and a front electrode layer on the CIGS light absorbing layer.

FIG. 1 shows a method of manufacturing a solar cell including a CIGS light absorbing layer according to an embodiment of the present invention.

As shown in FIG. 1, in order to manufacture a solar cell 1 including a CIGS light absorbing layer 30 according to an embodiment of the present invention, first, a lower electrode layer 20 is formed on a substrate 10. Thereafter, the CIGS light absorbing layer 30 is formed on the lower electrode layer 20 by supplying a copper precursor to deposit a copper thin film 31 using chemical vapor deposition and then supplying a gallium precursor, an indium precursor, and a first selenium precursor to deposit a gallium thin film 32 and an indium-selenium thin film 33 using chemical vapor deposition. Thereafter, a buffer layer 40 and a front electrode layer 50 are sequentially formed on the CIGS light absorbing layer 30.

Further, the present invention provides a solar cell including the lower electrode layer, the CIGS light absorbing layer, the buffer layer and the front electrode layer sequentially formed on the substrate, wherein a selenium deficit occurs in a lower surface region of the CIGS light absorbing layer in contact with the lower electrode layer.

Figure 2:
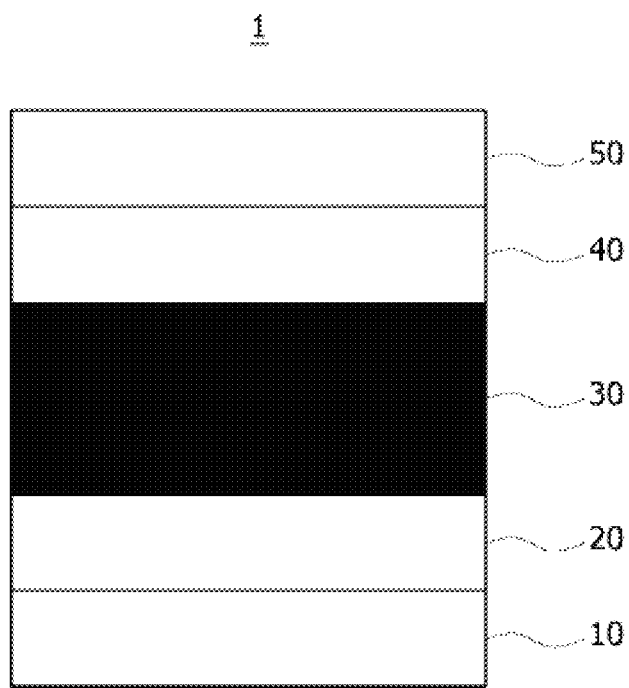
FIG. 2 shows a solar cell including a CIGS light absorbing layer according to an embodiment of the present invention.

FIG. 2 shows a solar cell including a CIGS light absorbing layer according to an embodiment of the present invention.

As shown in FIG. 2, the solar cell 1 including the CIGS light absorbing layer 30 according to an embodiment of the present invention includes the lower electrode layer 20, the CIGS light absorbing layer 30, the buffer layer 40 and the front electrode layer 50 sequentially formed on the substrate 10, and a selenium deficit occurs in the lower surface region of the CIGS light absorbing layer 30 in contact with the lower electrode layer 20.

Formation of Substrate 10

The substrate 10 may be a glass substrate, a ceramic substrate, a metal substrate, a polymer substrate, etc.

For example, the glass substrate may be a soda-lime glass substrate or a high strain point soda glass substrate, the metal substrate may be a substrate including stainless steel or titanium, and the polymer substrate may be a polyimide substrate.

The substrate 10 may be transparent. The substrate 10 may be rigid or flexible.

Formation of Lower Electrode Layer 20

The lower electrode layer 20 is formed on the substrate 10, and as a conductive layer, may include a metal such as Mo.

The lower electrode layer 20 may be a single layer or may be formed of a plurality of layers of two or more layers. When the lower electrode layer 20 is formed of a plurality of layers of two or more layers, the layers may be formed of the same metal or may be formed of different metals.

The formation of the lower electrode layer 20 may be performed by one or more known methods selected from the group consisting of sputtering, simultaneous evaporation, chemical vapor deposition, atomic layer deposition, ion beam deposition, screen printing, spray dip coating, tape casting and inkjet deposition.

The thickness of the lower electrode layer 20 is preferably in the range of 0.1 to 1 μm, and more preferably 0.4 to 0.6 μm, but is not limited thereto.

Formation of CIGS Light Absorbing Layer 30

The CIGS light absorbing layer 30 is formed on the lower electrode layer 20, and is formed on the lower electrode layer 20 by supplying a copper precursor to deposit a copper thin film 31 using chemical vapor deposition and then supplying a gallium precursor, an indium precursor, and a first selenium precursor to deposit a gallium thin film 32 and an indium-selenium thin film 33 using chemical vapor deposition.

Chemical vapor deposition (CVD) is a step in a semiconductor manufacturing process, in which a metal thin film is formed by applying plasma and heat to a metal precursor. When chemical vapor deposition is used for the formation of the CIGS light absorbing layer 30, there are advantages such as high efficiency due to use of an evaporation material, ease in forming a large size, a simple device structure, realization of an affordable system price, etc. On the other hand, when using chemical vapor deposition, it is necessary to secure an optimum precursor suitable for a desired process, and it is necessary to set optimum conditions such as process temperature, pressure, and the like to obtain desired characteristics. In order to perform chemical vapor deposition, a chemical vapor deposition apparatus should be provided.

The chemical vapor deposition apparatus includes a chamber for maintaining the inside thereof in a vacuum state; a gate disposed at one side of the chamber for introducing the substrate 10 into the chamber; a substrate chuck (a heating block and a susceptor) disposed at a lower part of the chamber for mounting the substrate 10 and heating the substrate to a desired process temperature; and a showerhead disposed at an upper part of the chamber for supplying a process gas. Further, the showerhead is connected to a plurality of canisters disposed outside, and may receive a process gas (metal precursor or the like) from each canister.

The substrate 10 is introduced into the chamber through the gate and is fixed to the substrate chuck. After the substrate 10 is introduced into the chamber, the gate is sealed and the pressure inside the chamber is reduced. The pressure inside the chamber is preferably 0.01 mTorr to atmospheric pressure.

First, a copper precursor is supplied onto the lower electrode layer 20 to deposit a copper thin film 31 by chemical vapor deposition.

Due to the deposition of the copper thin film 31, direct contact between the surface of the lower electrode layer 20 containing Mo and the selenium precursor may be prevented, so that the formation of a $MoSe_x$ layer may be minimized.

Further, even when the copper thin film 31, the gallium thin film (or the gallium-selenium thin film) 32 and the indium-selenium thin film 33 are subjected to sufficient heat treatment to form the CIGS light absorbing layer 30 in a bulk state, a selenium deficit occurs in the lower surface region of the CIGS light absorbing layer 30 in contact with the lower electrode layer due to the deposition of the copper thin film 31. As a result, the formation of the $MoSe_x$ layer may be minimized.

Specifically, the copper precursor is preferably one or more selected from the group consisting of bis(acetylacetonato) copper, bis(2,2,6,6-tetramethylheptandionato) copper, bis(hexafluoroacetylacetonato) copper, (vinyltrimethylsilyl)(hexafluoroacetylacetonato) copper, (vinyltrimethylsilyl)(acetylacetonato) copper, (vinyltrimethylsilyl)(2,2,6,6-tetramethylheptandionato) copper, (vinyltriethylsilyl)-(acetylacetonato) copper, (vinyltriethylsilyl)-(2,2,6,6-teramethylheptandionato) copper and (vinyltriethylsilyl)-(hexafluoroacetylacetonato) copper, but is not limited thereto.

Here, the temperature of the canister for supplying the copper precursor is determined in consideration of the vapor pressure of the copper precursor. The copper precursor is preferably supplied while a canister temperature is maintained at −40 to 100° C., and preferably 25 to 80° C., and a feed line temperature is maintained at 25 to 200° C., but the present invention is not limited thereto. It is preferable that, when the copper precursor is supplied, the temperature of the substrate 10 is preferably maintained at 25 to 600° C., and one or more gases selected from the group consisting of argon gas, helium gas and nitrogen gas is used as a carrier gas.

The deposition thickness of the copper thin film 31 is preferably in the range of 50 to 1000 nm, but is not limited thereto. Here, when the deposition thickness of the copper thin film 31 is out of the above-described range, it is difficult to realize the ideal band gap energy of the CIGS light absorbing layer 30.

Next, the gallium precursor, the indium precursor and the first selenium precursor are supplied to deposit the gallium thin film 32 and the indium-selenium thin film 33 by chemical vapor deposition.

Particularly, due to the deposition of the gallium thin film 32, the band gap energy of the CIGS light absorbing layer 30 may be appropriately adjusted to 1.2 to 1.8 eV, and preferably 1.3 to 1.5 eV, and thus the performance of the solar cell 1 may be improved.

Here, there is an advantage in that, since the gallium precursor, the indium precursor and the first selenium precursor are sequentially supplied so that the gallium thin film 32 is deposited first and then the indium-selenium thin film 33 is deposited, the performance of the solar cell 1 may be further improved.

Specifically, the gallium precursor preferably includes one or more selected from the group consisting of trimethyl gallium, triethyl gallium, triisopropyl gallium, tributyl gallium, tritertiarybutyl gallium, trimethoxy gallium, triethoxy gallium, triisopropoxy gallium, dimethylisopropoxy gallium, diethylisopropoxy gallium, dimethylethyl gallium, diethylmethyl gallium, dimethylisopropyl gallium, diethylisopropyl gallium and dimethyltertiarybutyl gallium, but is not limited thereto.

Here, the temperature of the canister for supplying the gallium precursor is determined in consideration of the vapor pressure of the gallium precursor, and the gallium precursor is preferably supplied while a canister temperature is maintained at −40 to 100° C., and preferably −40 to 30° C., and a feed line temperature is maintained at 25 to 200° C., but the present invention is not limited thereto. It is preferable that, when the gallium precursor is supplied, the temperature of the substrate 10 is preferably maintained at 25 to 600° C., and one or more gases selected from the group consisting of argon gas, helium gas and nitrogen gas is used as a carrier gas.

Specifically, the indium precursor preferably includes one or more selected from the group consisting of trimethyl indium, triethyl indium, triisopropyl indium, tributyl indium, tritertiarybutyl indium, trimethoxy indium, triethoxy indium, triisopropoxy indium, dimethylisopropoxy indium, diethylisopropoxy indium, dimethylethyl indium, diethylmethyl indium, dimethylisopropyl indium, diethylisopropyl indium and dimethyltertiarybutyl indium, but is not limited thereto.

Specifically, the first selenium precursor preferably includes one or more selected from the group consisting of dimethyl selenide, diethyl selenide, diisopropyl selenide, ditertiarybutyl selenide, dimethyl diselenide, diethyl diselenide, diisopropyl diselenide, ditertiarybutyl diselenide, tertiarybutylisopropyl selenide and tertiarybutylselenol, but is not limited thereto.

Here, the temperature of the canister for supplying the indium precursor and the first selenium precursor is determined in consideration of the vapor pressure of each of the indium precursor and the first selenium precursor. The indium precursor is preferably supplied while a canister temperature is maintained at −40 to 100° C., and preferably −40 to 30° C., and a feed line temperature is maintained at 25 to 200° C., and the first selenium precursor is preferably supplied while a canister temperature is maintained at −40 to 100° C., and preferably 25 to 80° C., and a feed line temperature is maintained at 25 to 200° C., but the present invention is not limited thereto. It is preferable that, when the indium precursor and the first selenium precursor are simultaneously supplied, the temperature of the substrate 10 is preferably maintained at 25 to 600° C., and one or more gases selected from the group consisting of argon gas, helium gas and nitrogen gas is used as a carrier gas.

The deposition thickness of the gallium thin film 32 is preferably in the range of 10 to 300 nm, and the deposition thickness of the indium-selenium thin film 33 is preferably in the range of 100 to 2000 nm, but the present invention is not limited thereto. Here, when the deposition thicknesses of the gallium thin film 32 and the indium-selenium thin film 33 are out of the above-described ranges, it is difficult to realize the ideal band gap energy of the CIGS light absorbing layer 30.

Alternatively, instead of the single deposition of the gallium thin film 32, a gallium-selenium thin film 32' may be deposited by simultaneously supplying the second selenium precursor and the gallium precursor.

As described above, when the gallium-selenium thin film 32' is deposited, the selenium content in the CIGS may be further increased, and thus the solar cell performance may be further improved.

The second selenium precursor may be the same as or different from the above-described first selenium precursor. Specifically, the second selenium precursor preferably includes dimethyl selenide, diethyl selenide, diisopropyl selenide, ditertiarybutyl selenide, dimethyl diselenide, diethyl diselenide, diisopropyl diselenide, ditertiarybutyl diselenide, tertiarybutylisopropyl selenide and tertiarybutylselenol, but the present invention is not limited thereto.

After deposition of the copper thin film 31, the gallium thin film (or gallium-selenium thin film) 32 and the indium-selenium thin film 33, heat treatment may be further performed. The heat treatment is preferably performed at a temperature of 200 to 600° C. for 1 to 50 minutes, and more preferably performed at a temperature of 400 to 600° C. for 30 minutes to 45 minutes, but the present invention is not limited thereto. The copper thin film 31, the gallium thin film (or the gallium-selenium thin film) 32 and the indium-selenium thin film 33 may be subjected to a sufficient heat treatment by optimizing the heat treatment temperature and the heat treatment time as described above, so that the CIGS light absorbing layer 30 in a bulk state may be produced. Here, the heat treatment may be performed under at least one atmospheric gas selected from the group consisting of argon, helium, nitrogen, hydrogen sulfide ($H_2S$) and hydrogen selenide ($H_2Se$).

That is, the CIGS light absorbing layer 30 is characterized in that a selenium deficit occurs in the lower surface region of the CIGS light absorbing layer 30 in contact with the lower electrode layer 20, and may be produced according to the above-described method.

According to the present invention, the formation of the $MoSe_x$ layer may be minimized due to the prevention of direct contact between the surface of the lower electrode layer 20 including Mo and the selenium precursor and the occurrence of a selenium deficit in the lower region of the CIGS light absorbing layer 30 in contact with the lower electrode layer 20. The thickness of the $MoSe_x$ layer formed between the lower electrode layer 20 and the CIGS light absorbing layer 30 may be 10 nm or less, and more preferably, the $MoSe_x$ layer is not formed. However, the present invention is not limited thereto.

On the other hand, a copper deficit occurs in the upper surface region of the CIGS light absorbing layer 30 in contact with the buffer layer 40, and thus there is an advantage in that the performance of the solar cell 1 may be further improved due to the copper deficit in the upper surface region of the CIGS light absorbing layer 30 in contact with the buffer layer 40.

The band gap energy of the CIGS light absorbing layer 30 is preferably in the range of 1.2 to 1.8 eV, but is not limited thereto. The band gap energy in the range of 1.2 to 1.8 eV may be controlled by optimizing the composition of copper, gallium, indium and selenium in the CIGS light absorbing layer 30. By maintaining the above-described range, the open-circuit voltage $V_{oc}$ of the solar cell 1 may be greatly increased.

The porosity of the CIGS light absorbing layer 30 may be in the range of 0.1% to 10%. Here, when the porosity of the CIGS light absorbing layer 30 is out of the above-described range, a current leakage path is generated, and the photoelectric conversion efficiency of the solar cell is lowered.

The average crystal grain size of the CIGS light absorbing layer 30 may be large. Here, when the average crystal grain size of the CIGS light absorbing layer 30 is too small, the grain boundaries between the crystals interfere with the current flow, and thus the photoelectric conversion efficiency of the solar cell 1 is lowered.

The final thickness of the CIGS light absorbing layer 30 is preferably in the range of 500 to 3000 nm, but is not limited thereto. Here, when the final thickness of the CIGS light absorbing layer 30 is out of the above-described range, the photoelectric conversion efficiency of the solar cell 1 is lowered.

Formation of Buffer Layer 40

The buffer layer 40 may be formed of at least one layer on the CIGS light absorbing layer 30. The buffer layer 40 may be formed of CdS, InS, ZnS or Zn (O, S) or the like by sputtering, a chemical solution method, chemical vapor deposition, atomic layer deposition, etc. Here, the buffer layer 40 is an n-type semiconductor layer, and the CIGS light absorbing layer 30 is a p-type semiconductor layer. Therefore, the CIGS light absorbing layer 30 and the buffer layer 40 form a p-n junction.

That is, since the CIGS light absorbing layer 30 and the front electrode layer 50 have a large difference in lattice constant and band gap energy, the buffer layer 40 having a lattice constant and a band gap energy which are at an intermediate level between the two materials may be inserted between the two layers to form an excellent junction.

Formation of Front Electrode Layer 50

The front electrode layer 50 is formed on the buffer layer 40, and the front electrode layer 50 is a window layer forming a p-n junction with the CIGS light absorbing layer 30, and may be formed of ZnO, ZnO doped with aluminum (Al) or alumina ($Al_2O_3$), ITO, or the like by sputtering, etc.

The front electrode layer 50 may have a double structure in which an n-type ZnO thin film or an indium tin oxide (ITO) thin film with excellent electro-optical properties is deposited on the i-type ZnO thin film.

Here, the first layer formed on the buffer layer 40 functions as a transparent electrode on the front surface of the solar cell, and thus should have high light transmittance and high electrical resistance to block the shunt path of the flow of photoelectrons. Accordingly, the first layer is preferably formed of an undoped i-type ZnO thin film. Further, it is suitable to use a ZnO thin film doped with aluminum (Al), alumina ($Al_2O_3$), boron (B), magnesium (Mg), or gallium (Ga) with excellent good current flow due to low resistance, or an indium tin oxide (ITO) thin film as the second layer deposited on the i-type ZnO thin film.

Therefore, the solar cell 1 according to the present invention is characterized in that the CIGS light absorbing layer 30 having low porosity and a large average crystal grain size is formed on the lower electrode layer 20 by supplying the copper precursor on the lower electrode layer 20 to deposit the copper thin film 31 by chemical vapor deposition, and then supplying the gallium precursor, the indium precursor and the first selenium precursor to deposit the gallium thin film 32 and the indium-selenium thin film 33 by chemical vapor deposition, and thus not only can the formation of the $MoSe_x$ layer be minimized, but also the performance of the solar cell can be improved.

Hereinafter, preferred embodiments of the present invention will be described in order to facilitate understanding of the present invention. However, the following examples are provided only for the purpose of easier understanding of the present invention, and the present invention is not limited by the following examples.

Example 1

An Mo electrode prepared on a soda-lime glass substrate was coated by DC sputtering to form a lower electrode layer having a thickness of about 0.49 μm. Cu(hfac)2 (canister temperature=40° C., feed line temperature=100° C., substrate temperature=250° C., carrier gas=Ar) was supplied as a Cu precursor to deposit a Cu thin film having a thickness of 0.3 μm on the lower electrode layer by chemical vapor deposition. Thereafter, triethyl gallium (canister temperature=10° C., feed line temperature=100° C., substrate temperature=250° C., carrier gas=Ar) was supplied alone as a Ga precursor to deposit a Ga thin film having a thickness of 0.1 μm by chemical vapor deposition, and then trimethyl indium (canister temperature=10° C., feed line temperature=100° C., substrate temperature=250° C., carrier gas=Ar) as an In precursor and diethyl selenide (canister temperature=30° C., feed line temperature=100° C., substrate temperature=250° C., carrier gas=Ar) as a Se precursor were simultaneously supplied to deposit an In—Se thin film having a thickness of 1.1 μm by chemical vapor deposition. Thereafter, the resultant was heat-treated at 550° C. for 15 minutes to form a CIGS light absorbing layer having a thickness of 1.5 μm.

Figure 3:
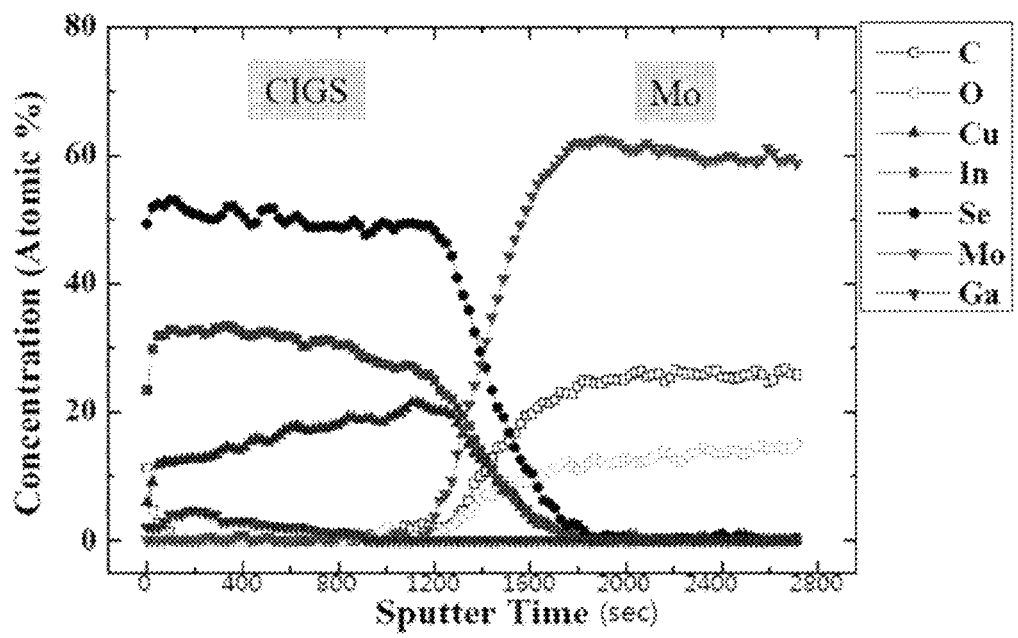
FIG. 3 shows a change in the composition ratio of each element along the thickness direction in the CIGS light absorbing layer by Auger electron spectroscopy (AES).

FIG. 3 shows a change in the composition ratio of each element along the thickness direction in the CIGS light absorbing layer by Auger electron spectroscopy (AES).

Specifically, Auger electron spectroscopy (AES) was performed by irradiating the surface of the CIGS light absorbing layer with an electron beam, and measuring the energy of Auger electrons emitted in real time to analyze the type and content of the elements forming the surface.

As shown in FIG. 3, it was confirmed that a copper deficit occurred in the upper surface region of the CIGS light absorbing layer (sputter time=about 0 sec), and a selenium deficit occurred in the lower surface region of the CIGS light absorbing layer (sputter time=about 1200 sec).

Thereafter, a CdS buffer layer having a thickness of 0.05 μm was formed on the CIGS light absorbing layer by chemical bath deposition, and then an i-type ZnO thin film having a thickness of 0.05 μm and a ZnO thin film doped with 2% aluminum and having a thickness of 0.5 μm each were deposited by RF sputtering to form the front electrode layer, thereby finally manufacturing a solar cell.

Example 2

A solar cell was finally manufactured in the same manner as in Example 1, except that the heat treatment time was changed to 30 minutes.

Example 3

A solar cell was finally manufactured in the same manner as in Example 1, except that the heat treatment time was changed to 45 minutes.

Example 4

A solar cell was finally manufactured in the same manner as in Example 1, except that the heat treatment time was changed to 60 minutes.

Comparative Examples 1 to 4

Solar cells were finally manufactured in the same manner as in Examples 1 to 4 except that the deposition of the Ga thin film was omitted.

Experimental Example (1) Measurement of Porosity of CIGS Light Absorbing Layer and Observation of Average Crystal Grain Size of CIGS Light Absorbing Layer The porosity of the CIGS light absorbing layer in the solar cell manufactured according to Example 1 was calculated and measured through a scanning electron microscope (SEM) image, and the specific results thereof are shown in the following Table 1 and FIG. 4.

TABLE 1

| Classification | Porosity (%) |
|---|---|
| Example 1 | 3 |

Figure 4:
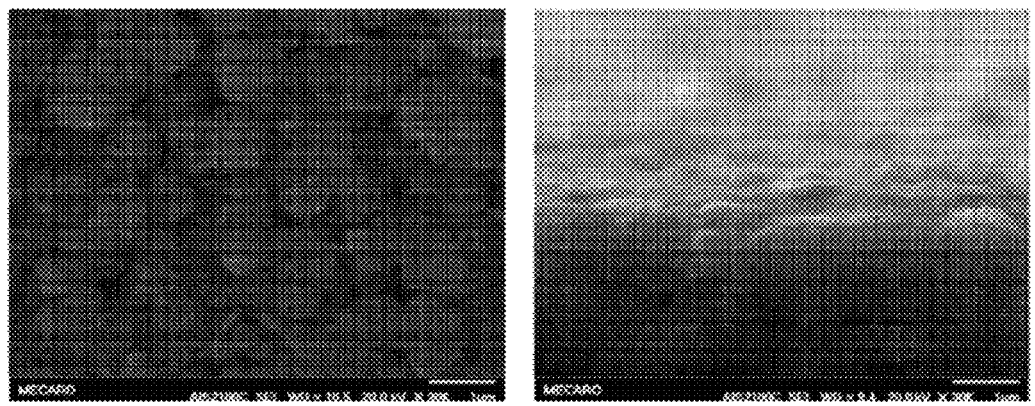
FIG. 4 is a scanning electron microscope (SEM) photograph showing a top surface and a cross section of a CIGS light absorbing layer of a solar cell according to Example 1.

Further, the average crystal grain size of the CIGS light absorbing layer in the solar cell manufactured according to Example 1 was observed through a scanning electron microscope (SEM) image, and the result thereof is shown in FIG. 4.

FIG. 4 is a scanning electron microscope (SEM) of a cross section of the CIGS light absorbing layer of the solar cell according to Example 1.

As shown in Table 1 and FIG. 4, it was confirmed that the CIGS light absorbing layer of the solar cell according to Example 1 had low porosity and a large average crystal grain size.

(2) Evaluation of Performance of Solar Cell

Figure 5:
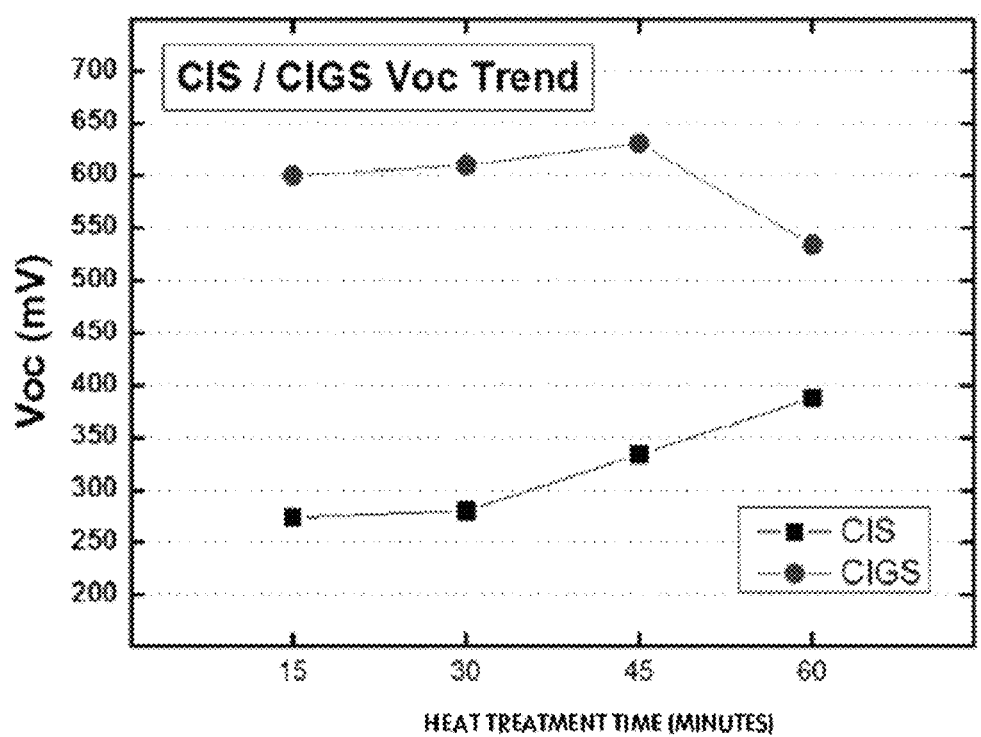
FIG. 5 is a graph showing the open circuit voltage of solar cells according to Examples 1 to 4 and Comparative Examples 1 to 4.

The open-circuit voltages ($V_{oc}$) of the solar cells finally manufactured according to Examples 1 to 4 and Comparative Examples 1 to 4 were evaluated, and the results thereof are shown in Table 2 and FIG. 5.

TABLE 2

| Classification | Voc (mV) |
|---|---|
| Example 1 | 600 |
| Example 2 | 605 |
| Example 3 | 631 |
| Example 4 | 534 |
| Comparative Example 1 | 274 |
| Comparative Example 2 | 308 |
| Comparative Example 3 | 334 |
| Comparative Example 4 | 388 |

As shown in Table 2 and FIG. 5, in the case of Examples 1 to 4, the open circuit voltages $V_{oc}$ of the solar cells were much higher than those of Comparative Examples 1 to 4, and thus it was confirmed that the performance of the solar cells was excellent.

This is a result of applying a principle that the band gap energy of the CIGS light absorbing layer may be appropriately controlled through deposition of the Ga thin film under the optimum conditions to the solar cells according to Examples 1 to 4.

The foregoing description of the present invention has been presented for the purposes of illustration and description. It should be apparent to a person having ordinary skill in the art to which the present invention relates that the present invention can be easily modified into other detailed forms without changing the technical principle or essential features of the present invention. Therefore, the foregoing embodiments should be regarded as illustrative rather than limiting in all aspects.

The invention claimed is:

1. A method of manufacturing a solar cell, including the steps of:
   (a) forming a lower electrode layer including molybdenum (Mo) on a substrate;
   (b) forming a CIGS light absorbing layer on which a copper thin film, a gallium thin film and an indium-selenium thin film are stacked by supplying a gallium precursor to deposit the gallium thin film using chemical vapor deposition after supplying a copper precursor to the lower electrode layer to deposit a copper thin film using chemical vapor deposition and then supplying an indium precursor and a first selenium precursor to deposit the indium-selenium thin film using chemical vapor deposition or forming the CIGS light absorbing layer on which the copper thin film, a gallium-selenium thin film and the indium-selenium thin film are stacked by simultaneously supplying a second selenium precursor with the gallium precursor to deposit the gallium-selenium thin film using chemical vapor deposition after supplying the copper precursor to the lower electrode layer to deposit the copper thin film using chemical vapor deposition and then supplying the indium precursor and the first selenium precursor to deposit the indium-selenium thin film using chemical vapor deposition; and
   (c) sequentially forming a buffer layer and a front electrode layer on the CIGS light absorbing layer;
   wherein, in the step (b), the CIGS light absorbing layer is formed by performing heat treatment at a temperature of 400 to 600° C. for 15 to 45 minutes after depositing the indium-selenium thin film, and the buffer layer is formed of CdS, InS, ZnS or Zn (O, S).

2. The method according to claim 1, wherein, in the step (b), the gallium precursor includes one or more selected from the group consisting of trimethyl gallium, triethyl gallium, triisopropyl gallium, tributyl gallium, tritertiarybutyl gallium, trimethoxy gallium, triethoxy gallium, triisopropoxy gallium, dimethylisopropoxy gallium, diethylisopropoxy gallium, dimethylethyl gallium, diethylmethyl gallium, dimethylisopropyl gallium, diethylisopropyl gallium and dimethyltertiarybutyl gallium.

3. The method according to claim 1, wherein, in the step (b), the gallium precursor is supplied while a canister temperature is maintained at −40 to 100° C. and a feed line temperature is maintained at 25 to 200° C.

4. The method according to claim 1, wherein, in the step (b), the second selenium precursor includes one or more selected from the group consisting of dimethyl selenide, diethyl selenide, diisopropyl selenide, ditertiarybutyl selenide, dimethyl diselenide, diethyl diselenide, diisopropyl diselenide, ditertiarybutyl diselenide, tertiarybutylisopropyl selenide and tertiarybutylselenol.

5. The method according to claim 1, wherein the step (b) further includes a step of heat treatment.

* * * * *